(12) United States Patent
Moon et al.

(10) Patent No.: US 10,937,949 B1
(45) Date of Patent: Mar. 2, 2021

(54) METHOD OF FORMING DOUGHNUT-SHAPED SKYRMION

(71) Applicant: KOREA RESEARCH INSTITUTE OF STANDARDS AND SCIENCE, Daejeon (KR)

(72) Inventors: Kyoung-Woong Moon, Daejeon (KR); Chan Yong Hwang, Seoul (KR)

(73) Assignee: KOREA RESEARCH INSTITUTE OF STANDARDS AND SCIENCE

( * ) Notice: Subject to any disclaimer, the term of this patent is extended or adjusted under 35 U.S.C. 154(b) by 0 days.

(21) Appl. No.: 16/654,647

(22) Filed: Oct. 16, 2019

(51) Int. Cl.
*H01L 43/08* (2006.01)
*H01L 43/04* (2006.01)

(52) U.S. Cl.
CPC .............. *H01L 43/08* (2013.01); *H01L 43/04* (2013.01)

(58) Field of Classification Search
None
See application file for complete search history.

(56) References Cited

U.S. PATENT DOCUMENTS

| | | | |
|---|---|---|---|
| 2011/0261602 A1* | 10/2011 | Moutafis | B82Y 10/00 365/8 |
| 2018/0090195 A1* | 3/2018 | Mochizuki | G11B 5/02 |
| 2020/0006628 A1* | 1/2020 | O'Brien | H01F 41/302 |
| 2020/0243242 A1* | 7/2020 | Shibata | H01L 43/12 |

* cited by examiner

*Primary Examiner* — Steven B Gauthier
(74) *Attorney, Agent, or Firm* — Mendelsohn Dunleavy, P.C.

(57) ABSTRACT

Disclosed is a method of forming a doughnut-shaped skyrmion, the method including heating a local area of a vertical magnetic thin film magnetized in a first direction, which is any one of an upward direction and a downward direction, applying a magnetic field having a second direction, which is opposite the first direction, and having intensity higher than coercive force of the vertical magnetic thin film to the vertical magnetic thin film to form a first area magnetized in the second direction, applying a magnetic field having the second direction to the vertical magnetic thin film to form a second area, which is an extension of the first area, and applying a magnetic field having the first direction to the vertical magnetic thin film to form a third area magnetized in the first direction in the second area.

17 Claims, 8 Drawing Sheets

FIG. 8
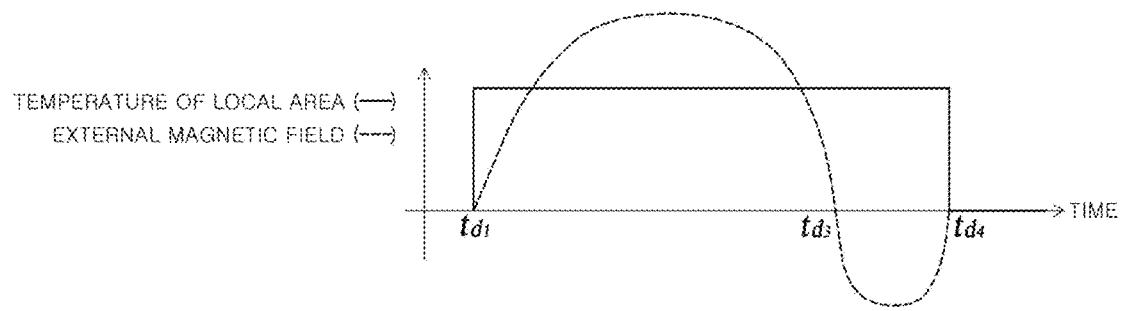
FIG. 9
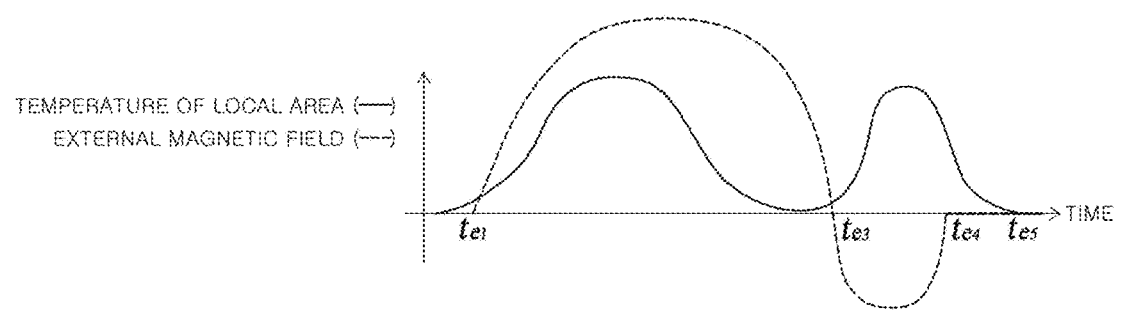
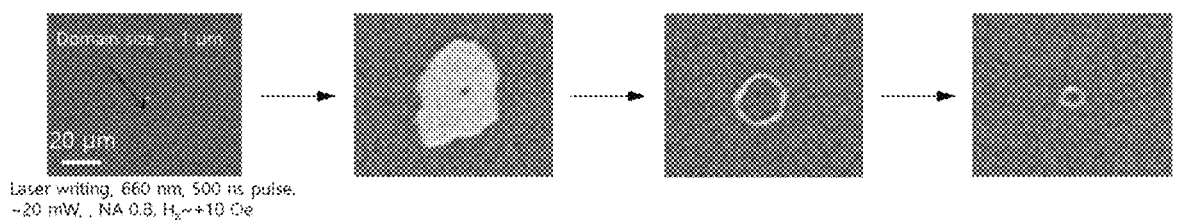
FIG. 10A    FIG. 10B    FIG. 10C    FIG. 10D

000
METHOD OF FORMING DOUGHNUT-SHAPED SKYRMION

STATEMENT OF GOVERNMENTAL SUPPORT

This invention was made with government support under Project No. CAP-16-01-KIST awarded by Fusion Research Business Program (CAP) through the National Research Council of Science & Technology (NST) funded by the Ministry of Science, ICT and Future Planning. The government support was made at a contribution rate of 1/1 for the research period of Jul. 1, 2019 through Jun. 30, 2021. The supervising institute was KOREA RESEARCH INSTITUTE OF STANDARDS AND SCIENCE.

BACKGROUND OF THE INVENTION

Field of the Invention

The present invention relates to a method of forming a doughnut-shaped skyrmion.

Description of the Related Art

Magnetization, which is a basic physical property of a magnetic body, is a vector value having a magnitude and a direction. A skyrmion means a uniquely magnetized state.

FIGS. 1A and 1B are views showing the magnetized state of a skyrmion. In FIGS. 1A and 1B, white circles indicate that magnetization is performed in the vertical upward direction, and black circles indicate that magnetization is performed in the vertical downward direction. Colored arrows indicate that the direction of magnetization gradually changes from the vertical upward direction to the vertical downward direction or from the vertical downward direction to the vertical upward direction.

When the state of 1A or 1B exists, the state may be sent to data "1". When the state of 1A or 1B does not exist, the state may be sent to data "0". As 1-bit data can be stored thereby, various research on use of a skyrmion as a memory device has been conducted.

When current flows in a magnetic body, however, the skyrmion moves in the state of not being in parallel to the direction in which the current flows (a skyrmion Hall effect), whereby it is not easy to control the movement of the skyrmion.

Meanwhile, such a skyrmion Hall effect does not occur in a doughnut-shaped skyrmion (a ring-shaped skyrmion), whereby the doughnut-shaped skyrmion exhibits more desirable properties as a memory device than a general skyrmion.

In connection therewith, Korean Registered Patent No. 10-1894756 discloses a method of applying a magnetic field from a magnetic field generation unit 14 to an insulative magnetic body 12 having a chiral crystal structure while locally applying a magnetic field to the magnetic body 12 using a magnetic field generation unit 16 to form a skyrmion in the magnetic body 12.

However, the above patent relates to a method of forming a general skyrmion, and a method of forming a doughnut-shaped skyrmion has not yet been proposed.

SUMMARY OF THE INVENTION

It is an object of the present invention to provide a method of stably forming a doughnut-shaped skyrmion.

In accordance with the present invention, the above and other objects can be accomplished by the provision of a method of forming a doughnut-shaped skyrmion, the method including heating a local area of a vertical magnetic thin film magnetized in a first direction, which is any one of an upward direction and a downward direction, applying a magnetic field having a second direction, which is opposite the first direction, and having intensity higher than coercive force of the vertical magnetic thin film to the vertical magnetic thin film to form a first area magnetized in the second direction, applying a magnetic field having the second direction to the vertical magnetic thin film to form a second area, which is an extension of the first area, and applying a magnetic field having the first direction to the vertical magnetic thin film to form a third area magnetized in the first direction in the second area.

At the step of forming the third area, the outer radius of the second area may be reduced.

Assuming that the intensity of the magnetic field applied in the first direction and the intensity of the magnetic field applied in the second direction are uniform and identical to each other and that time during which the magnetic field is applied in the first direction and time during which the magnetic field is applied in the second direction are identical to each other, the length (dr1) of the radius of the first area that increases when the first area extends to the second area may be greater than the length (dr2) of the outer radius of the second area that decreases.

The method may further include applying the magnetic field having the first direction to the vertical magnetic thin film having the third area formed therein such that the third area extends within a range within which the second area does not disappear to form a first doughnut shape.

The method may further include alternately applying the magnetic field having the second direction and the magnetic field having the first direction to the vertical magnetic thin film having the first doughnut shape formed therein to form a second doughnut shape, which is smaller than the first doughnut shape.

The intensity of the magnetic field applied at the step of forming the second doughnut shape may be lower than the intensity of the magnetic field applied at the step of forming the first doughnut shape.

Time during which the magnetic field is applied at the step of forming the second doughnut shape may be shorter than time during which the magnetic field is applied in the first direction or the second direction at the step of forming the first doughnut shape.

The local area may be continuously heated while the step of forming the first area, the step of forming the second area, and the step of forming the third area are performed.

Heating of the local area may be finished after application of the magnetic field in the first direction for forming the third area is finished.

The local area may be heated at uniform temperature. The local area may be heated to Curie temperature of the vertical magnetic thin film or higher.

Time at which the local area is heated and time at which the magnetic field is applied in the second direction may be identical to each other.

The magnetic field may be applied in the second direction after the local area starts to be heated.

The intensity of the magnetic field applied at the step of forming the first area may be higher than the intensity of the magnetic field applied at the step of forming the second area.

The intensity of the magnetic field applied at the step of forming the first area may be lower than the intensity of the magnetic field applied at the step of forming the second area.

The intensity of the magnetic field applied at the step of forming the first area may be identical to the intensity of the magnetic field applied at the step of forming the second area.

The vertical magnetic thin film may include a substrate, a first layer formed on the substrate, a magnetic layer formed on the first layer, a tunnel barrier layer formed on the magnetic layer, and a second layer formed on the tunnel barrier layer.

BRIEF DESCRIPTION OF THE DRAWINGS

The above and other objects, features and other advantages of the present invention will be more clearly understood from the following detailed description taken in conjunction with the accompanying drawings, in which:

FIG. 8 is an example of a timing diagram showing the temperature of a local area and the intensity of a magnetic field according to an embodiment of the present invention;

FIG. 9 is an example of a timing diagram showing the temperature of a local area and the intensity of a magnetic field according to an embodiment of the present invention;

FIGS. 10A to 10D are views showing the result of forming a doughnut-shaped skyrmion according to an embodiment of the present invention.

DETAILED DESCRIPTION OF THE INVENTION

Hereinafter, embodiments of the present invention will be described in detail with reference to the accompanying drawings.

FIGS. 2A to 2F are views illustrating a method of forming a doughnut-shaped skyrmion according to an embodiment of the present invention. FIGS. 2A to 2F are plan views of a vertical magnetic thin film when viewed from above, wherein the black color indicates the state in which the vertical magnetic thin film is magnetized in the vertically downward direction and the gray color indicates the state in which the vertical magnetic thin film is magnetized in the vertically upward direction.

The method of forming the doughnut-shaped skyrmion according to the embodiment of the present invention includes a step of heating a local area of a vertical magnetic thin film magnetized in a first direction, which is any one of the upward direction and the downward direction, a step of applying a magnetic field having a second direction, which is opposite the first direction, and having intensity higher than coercive force of the vertical magnetic thin film to the vertical magnetic thin film to form a first area magnetized in the second direction, a step of applying a magnetic field having the second direction to the vertical magnetic thin film to form a second area, which is an extension of the first area, and a step of applying a magnetic field having the first direction to the vertical magnetic thin film to form a third area magnetized in the first direction in the second area.

Figure 1A:
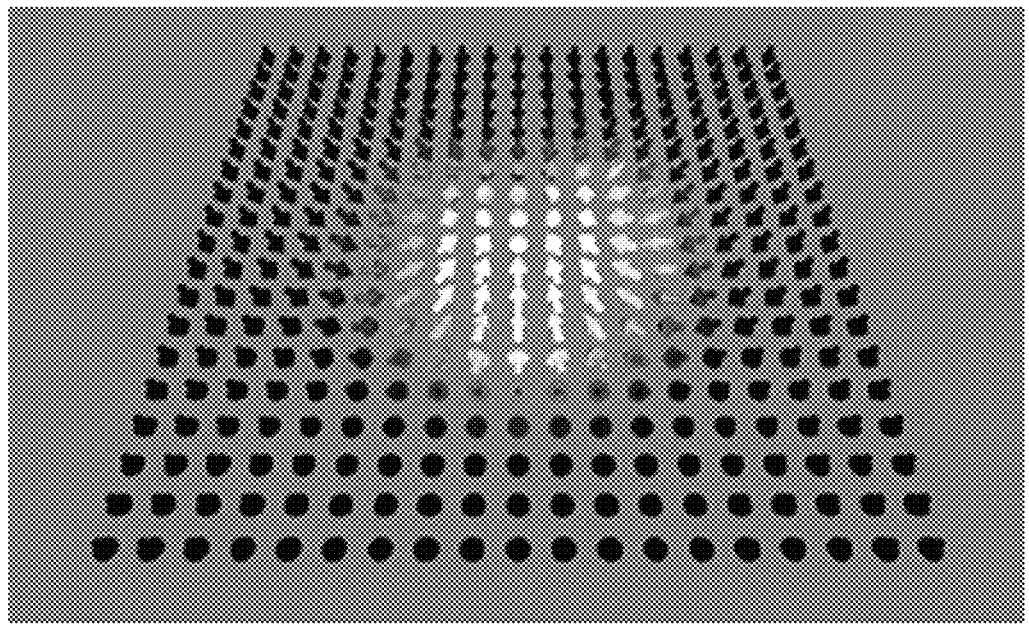
FIGS. 1A and 1B are views showing the magnetized state of a skyrmion.
Figure 1B:
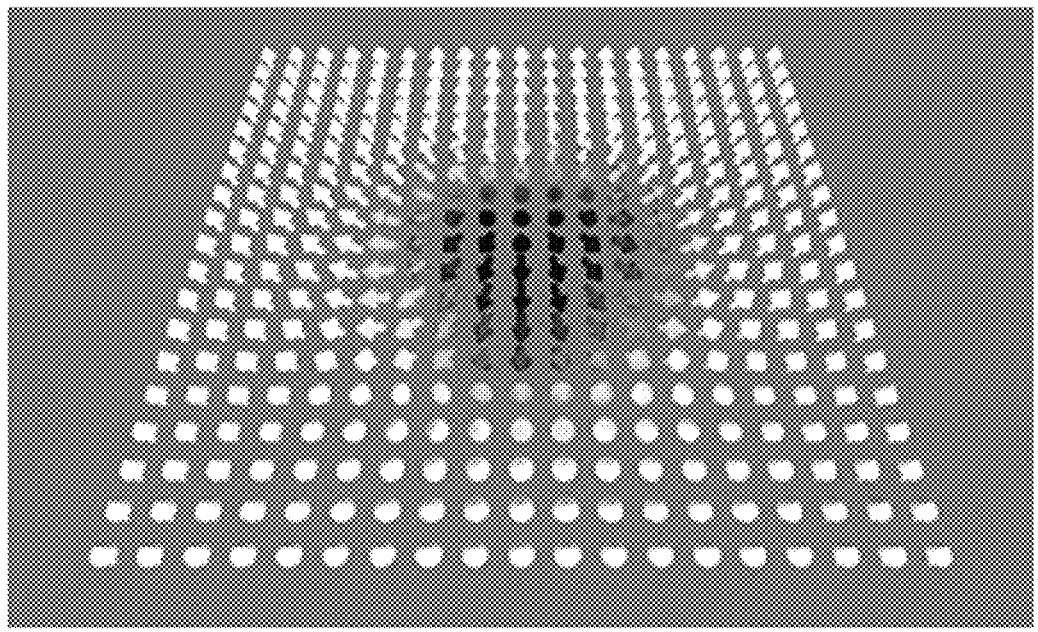
Figure 2A:
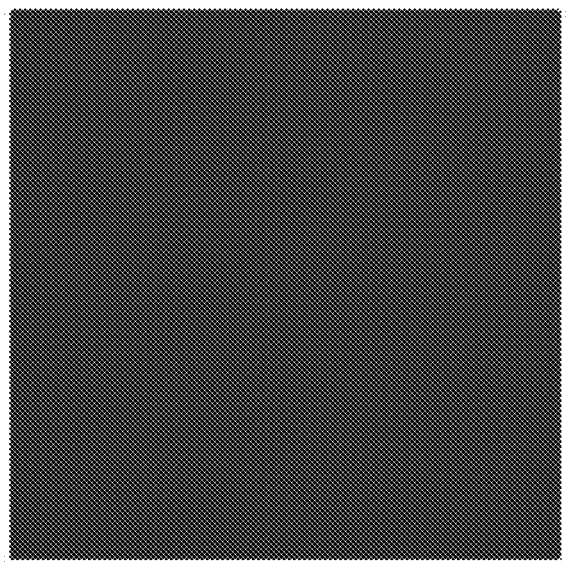
FIGS. 2A to 2F are views illustrating a method of forming a doughnut-shaped skyrmion according to an embodiment of the present invention.
Figure 2B:
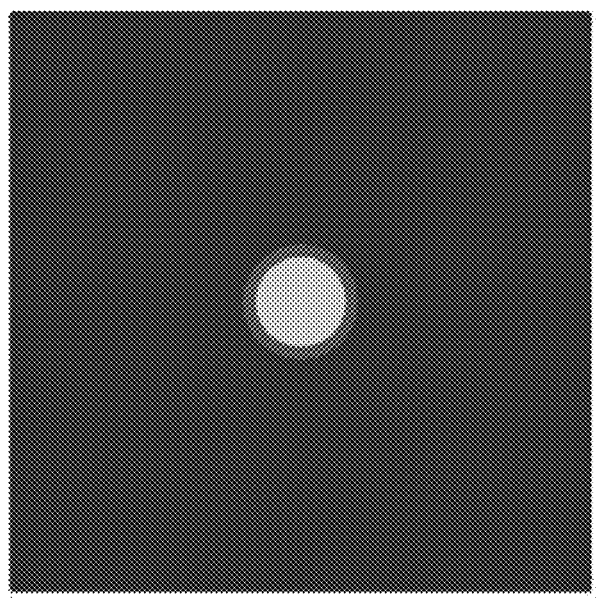
Figure 2C:
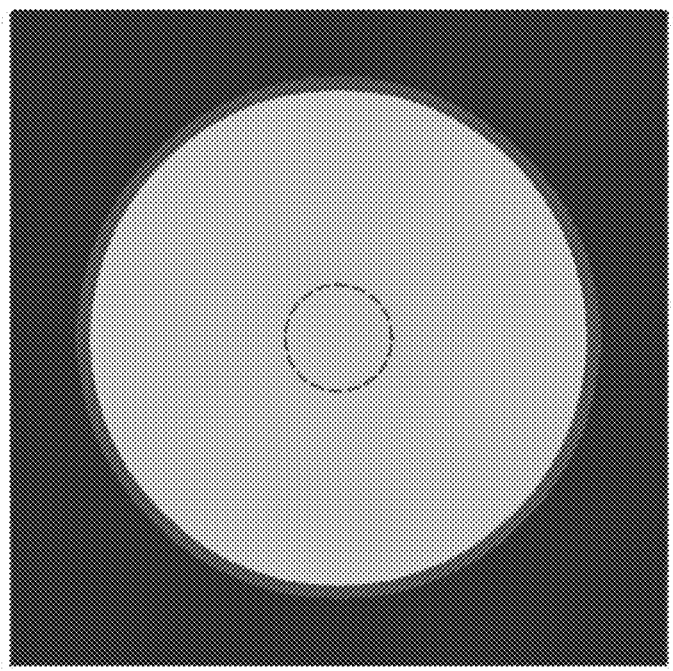
Figure 2D:
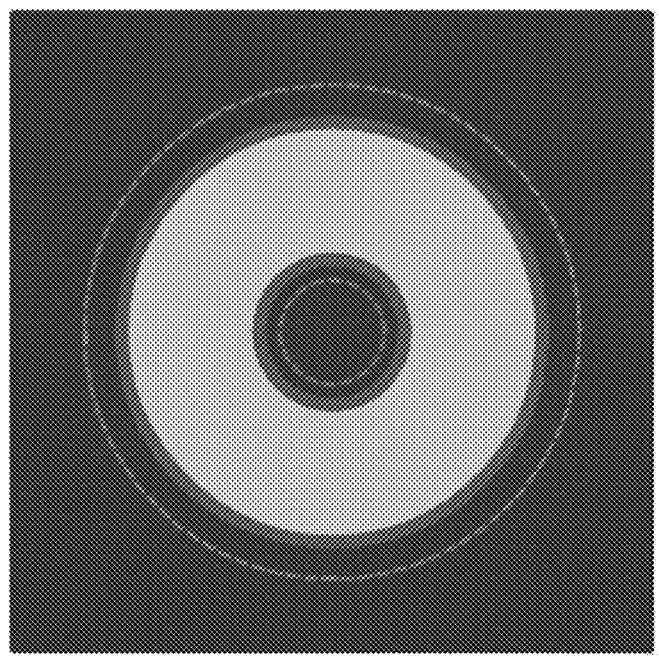

Referring to FIGS. 2A to 2F, FIG. 2A shows a vertical magnetic thin film magnetized in the first direction, FIG. 2B shows the state in which a first area is formed, FIG. 2C shows the state in which the first area extends to form a second area, and FIG. 2D shows the state in which a third area is formed in the second area.

In this embodiment, the first direction may be the downward direction, and the second direction may be the upward direction.

Referring to FIG. 2A to FIG. 2D, a vertical magnetic thin film magnetized in the downward direction is prepared first.

Subsequently, a local area of the vertical magnetic thin film starts to be heated. Heating may be performed, for example, using a laser. However, the present invention is not limited thereto as long as the local area can be heated.

Subsequently, an upward magnetic field is applied to the entire vertical magnetic thin film. As a result, as shown in FIG. 2B, a first area is formed in the upward direction. Application of the upward magnetic field may be performed simultaneously with heating of the local area, or may be performed after the local area starts to be heated.

Subsequently, the upward magnetic field is continuously applied to the vertical magnetic thin film having the first area formed therein, and the local area is continuously heated, whereby a second area, which is an extension of the first area, is formed, as shown in FIG. 2C.

Subsequently, a downward magnetic field is continuously applied to the vertical magnetic thin film having the second area formed therein to form a third area magnetized in the downward direction in the second area. As a result, as shown in FIG. 2D, a (primitive) doughnut-shaped skyrmion is formed.

Figure 2E:
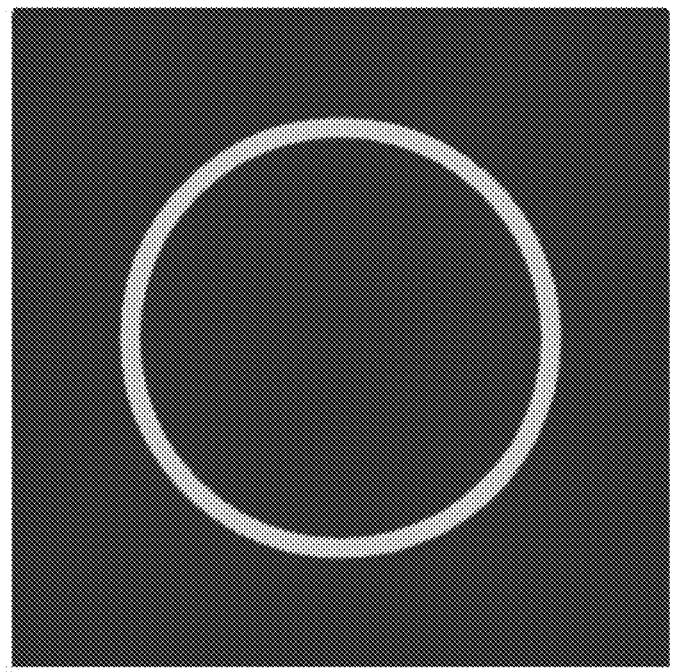

The doughnut-shaped skyrmion is formed only through the above processes. In order to improve stability of the skyrmion, however, a step of continuously applying the downward magnetic field (the magnetic field having the first direction) to the vertical magnetic thin film having the third area formed therein such that the third area extends within a range within which the second area does not disappear to form a first doughnut shape may be further included depending on embodiments. As a result, as shown in FIG. 2E, a ring-shaped skyrmion, which is thinner than the doughnut-shaped skyrmion shown in FIG. 2D, may be formed.

Figure 2F:
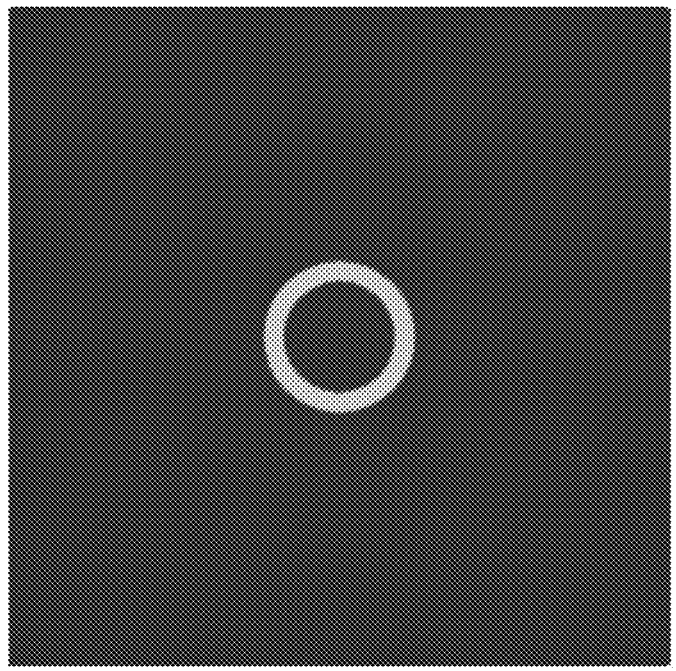

In order to further improve stability of the skyrmion, a step of alternately applying the upward magnetic field and the downward magnetic field to the vertical magnetic thin film having the first doughnut shape formed therein to form a second doughnut shape, which is smaller than the first doughnut shape, as shown in FIG. 2F, may be further included depending on embodiments.

The intensity of the magnetic field that is applied at this time may be lower than the intensity of the magnetic field that is applied at the step of forming the first doughnut shape.

The time during which the upward magnetic field or the downward magnetic field is applied at this time may be shorter than the time during which the downward magnetic field is applied at the step of forming the first doughnut shape.

At the step of forming the second doughnut shape, a magnetic field having higher intensity and shorter duration than the magnetic field applied at the step of forming the first doughnut shape may be repeatedly applied depending on embodiments.

Figure 3:
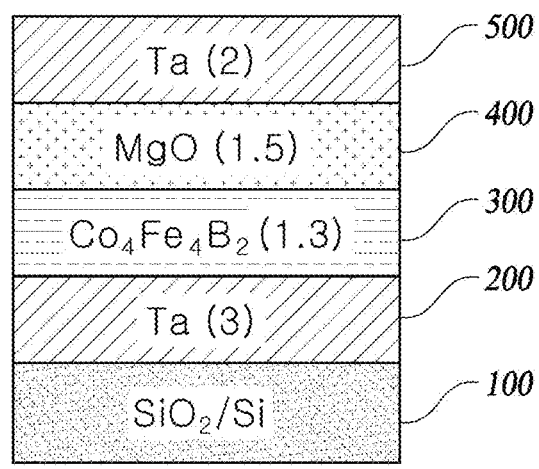
FIG. 3 is a view showing the structure of a vertical magnetic thin film according to an embodiment of the present invention.

FIG. 3 is a view showing the structure of a vertical magnetic thin film according to an embodiment of the present invention.

Referring to FIG. 3, the vertical magnetic thin film according to the embodiment of the present invention may include a substrate 100, a first layer 200, a magnetic layer 300, a tunnel barrier layer 400, and a second layer 500. FIG. 3 shows the vertical section of the vertical magnetic thin film.

As shown in FIG. 3, the substrate 100 may be a $SiO_2/Si$ substrate.

Each of the first layer 200 and the second layer 400 may be made of Ta. However, the present invention is not limited thereto. Each of the first layer 200 and the second layer 400 include at least one of platinum (Pt), tantalum (Ta), tungsten (W), hafnium (Hf), rhenium (Re), iridium (Ir), copper (Cu), gold (Au), silver (Ag), titanium (Ti), platinum-manganese (PtMn), iron-manganese (ReMn), iridium-manganese (IrMn), bismuth selenide ($Bi_2Se_3$), bismuth telluride ($Bi_2Te_3$), molybdenum disulfide ($MoS_2$), tungsten telluride ($WTe_2$), indium arsenide (InAs), gallium arsenide (GaAs), two-dimensional transition metal dichalcogenides (TMDs), III-V semiconductors, or superconductors. In addition, the first layer 200 and the second layer 400 may be made of the same material, or may be made of different materials.

The magnetic layer 300 may be made of $Co_4Fe_4B_2$. However, this is merely an illustration, and the magnetic layer 300 may be made of another material that exhibits a property of preferring a perpendicular magnetization direction, i.e. perpendicular magnetic anisotropy. For example, the magnetic layer 300 may include iron (Fe) and boron (B) on a cobalt film, may include iron and gadolinium (Gd) on the cobalt film, may include iron and terbium (Tb) on the cobalt film, or may include iron, gadolinium, terbium, dysprosium (Dy), and holmium (Ho) on the cobalt film.

The tunnel barrier layer 400 is provided to increase tunneling magnetoresistance (TMR), and may include, for example, magnesium oxide (MgO).

Hereinafter, conditions in which a doughnut-shaped skyrmion is formed will be described with reference to FIG. 4.

Figure 4A:
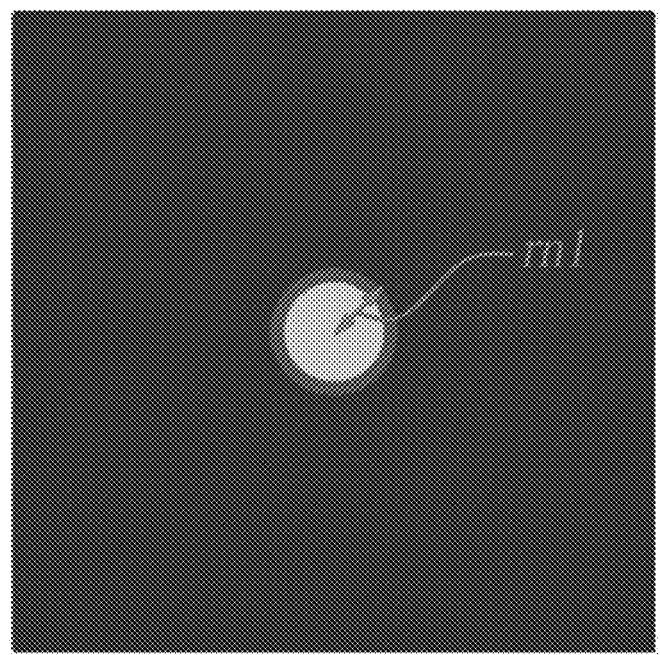
FIGS. 4A, 4B and 4C are views illustrating conditions in which a doughnut-shaped skyrmion is formed.
Figure 4B:
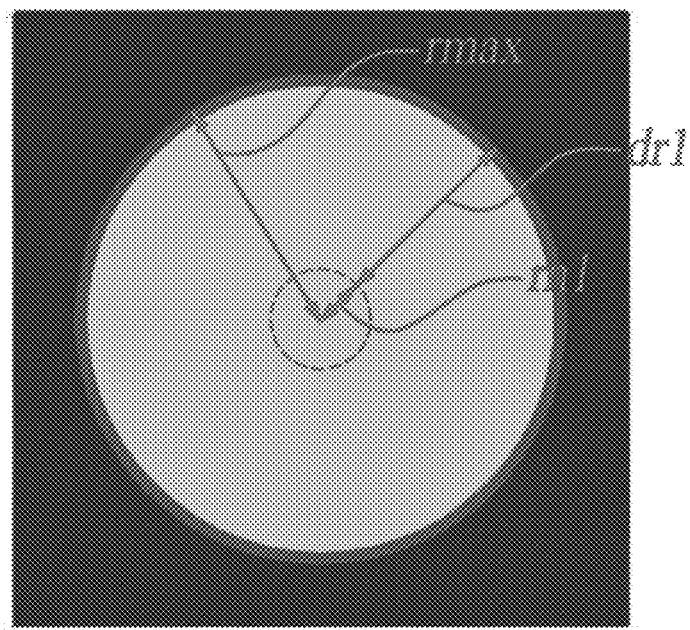
Figure 4C:
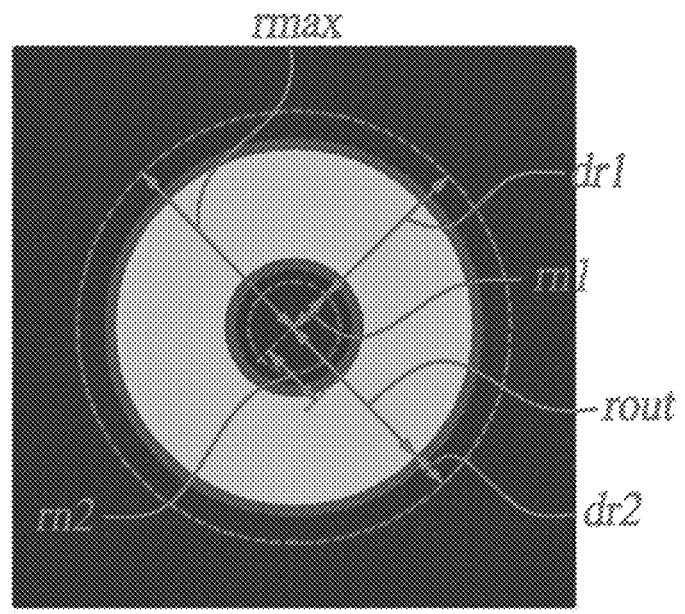

FIGS. 4A to 4C, which correspond respectively to FIGS. 2B to 2D, are views illustrating conditions in which a doughnut-shaped skyrmion is formed.

It is assumed that the intensity of an external magnetic field is changed in the state in which a laser is continuously ON (in order to heat a local area of a vertical magnetic thin film).

First, an external upward magnetic field is applied to the vertical magnetic thin film in the state in which the laser is ON. At this time, in the case in which the intensity of the external magnetic field is higher than coercive force $H_c(T)$ at heating temperature T of the laser, a first area having a radius rn1 is formed, as shown in FIG. 4A.

On the assumption that the intensity of the external magnetic field at this time is Hup1 and the time during which the external magnetic field having the intensity of Hup1 is applied is tup1, rn1 may be defined as follows in the case in which an area that is heated is fixed, since rill is a function of a magnetic field and time:

$rn1:=rn1(Hup1,tup1)$

When an upward magnetic field having intensity Hup2 is applied during time tup2 in this state, the first area extends, whereby a second area having a radius rmax is formed, as shown in FIG. 4B.

Here, on the assumption that dr1=rmax−rn1, rmax may be defined as follows:

$Rmax::=rn1+dr1(rn1,Hup2,tup2)$

Subsequently, when a downward magnetic field having intensity Hdown1 is applied during time tdown1, the outer radius of the second area is reduced, and a third area magnetized in the downward direction is formed in the second area, as shown in FIG. 4C.

Here, it is assumed that the reduced outer radius of the second area is rout, the radius of the third area is rn2, and rmax−rout, i.e. the reduced length of the second area, is dr2, as shown in FIG. 4C.

As Hdown1 becomes higher and tdown1 becomes longer, dr2 further increases, and dr2 is in inverse proportion to rmax. In addition, as Hdown1 becomes higher and tdown1 becomes longer, rn2 further increases. Therefore, the following equation may be defined.

$dr2:=dr2(rmax,Hdown1,tdown1)$, $rn2:=rn2(Hdown1,tdown1)$

Finally, in order to form a doughnut-shaped skyrmion, the following inequality must be satisfied.

$rout>rn2$

Therefore, $rmax-dr2>rn2$, $rn1+dr1-dr2>rn2$

In the case in which the above inequalities are expressed together with variables, the following inequality is defined.

$rn1(Hup1,tup1)+dr1(rn1,Hup2,tup2)-dr2(rmax, Hdown1,tdown1)>rn2(Hdown1,tdown1)$

Here, on the assumption that Hup1=−Hdown1 and tup1=tdown1, it can be seen that the above inequalities are defined as follows, since rn1=rn2:

$dr1(rn1,Hup2,tup2)-dr2(rmax,Hdown1,tdown1)>0$, $dr1(rn1,Hup2,tup2)>dr2(rmax,Hdown1,tdown1)$ That is, the length dr1 of the radius of the first area that increases when the first area extends to the second area must be greater than the length dr2 of the outer radius of the second area that decreases as the result of applying the downward magnetic field.

Hereinafter, illustrations of conditions related to the intensity of an external magnetic field that is applied and the temperature at which a local area is heated will be described with reference to FIGS. 5 to 9.

Figure 5:
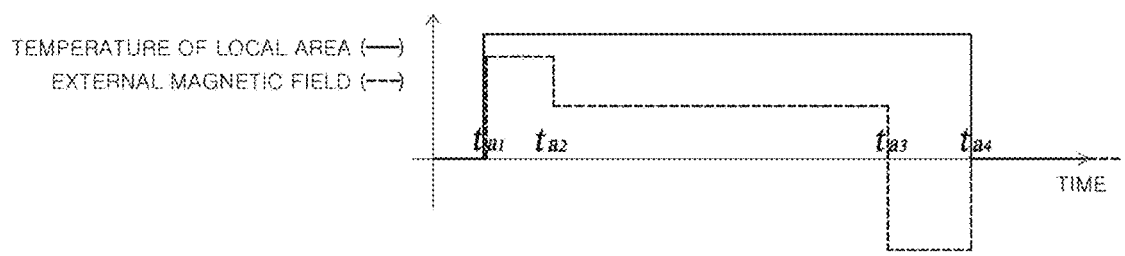
FIG. 5 is an example of a timing diagram showing the temperature of a local area and the intensity of a magnetic field according to an embodiment of the present invention.

FIG. 5 is an example of a timing diagram showing the temperature of a local area and the intensity of a magnetic field according to an embodiment of the present invention.

Referring to FIG. 5, a vertical magnetic thin film magnetized in the downward direction is prepared, as shown in FIG. 2A.

At ta1, a local area is heated, and an external upward magnetic field starts to be applied. The intensity of the external magnetic field applied at this time is higher than coercive force at heating temperature. As a result, a first area magnetized in the opposite direction is formed after a predetermined time, i.e. at ta2, as shown in FIG. 2B.

At ta2, the intensity of the external magnetic field is reduced. At this time, the area magnetized in the upward direction gradually extends, since the external magnetic field is continuously applied in the upward direction. At ta3, therefore, a second area, which is an extension of the first area, is formed, as shown in FIG. 2C.

At ta3, a downward magnetic field starts to be applied. As a result, a third area magnetized in the downward direction is formed in the second area, as shown in FIG. 2D. At this time, the size of the second area magnetized in the upward direction at ta4 (the radius of the outer circumference thereof) becomes smaller than the size of the second area magnetized in the upward direction at ta3 (the radius of the circumference thereof).

Figure 6:
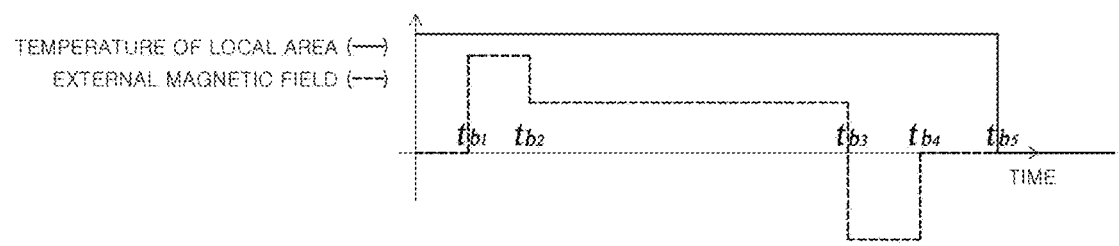
FIG. 6 is an example of a timing diagram showing the temperature of a local area and the intensity of a magnetic field according to an embodiment of the present invention.

FIG. 6 is an example of a timing diagram showing the temperature of a local area and the intensity of a magnetic field according to an embodiment of the present invention.

First, a vertical magnetic thin film magnetized in the downward direction is prepared, as shown in FIG. 2A. A local area of the vertical magnetic thin film starts to be heated without application of an external magnetic field.

During time from tb1 to tb2, an external upward magnetic field is applied. The intensity of the external magnetic field applied at this time is higher than coercive force at heating temperature. As a result, a first area magnetized in the opposite direction (i.e. magnetized in the upward direction) is formed at tb2, as shown in FIG. 2B.

At tb2, the intensity of the external magnetic field is reduced. At this time, the area magnetized in the upward direction gradually extends, since the external magnetic field is continuously applied in the upward direction. At tb3, therefore, a second area, which is an extension of the first area, is formed, as shown in FIG. 2C.

During time from tb3 to tb4, a downward magnetic field is applied. As a result, a third area magnetized in the downward direction is formed in the second area, as shown in FIG. 2D. At this time, the size of the second area magnetized in the upward direction at tb4 (the radius of the outer circumference thereof) becomes smaller than the size of the second area magnetized in the upward direction at tb3 (the radius of the circumference thereof).

At tb5, heating of the local area is finished.

In this embodiment, the time at which the local area starts to be heated (t=0) and the time at which the external upward magnetic field starts to be applied (t=tb1) are different from each other. In addition, the time at which application of the external magnetic field is finished (t=tb4) and the time at which heating of the local area is finished (t=tb5) are different from each other. Depending on embodiments, the time at which the local area starts to be heated and the time at which the external magnetic field starts to be applied may be different from each other, and the time at which application of the external magnetic field is finished and the time at which heating of the local area is finished may be identical to each other. Alternatively, the time at which the local area starts to be heated and the time at which the external magnetic field starts to be applied may be identical to each other, and the time at which application of the external magnetic field is finished and the time at which heating of the local area is finished may be different from each other.

Figure 7:
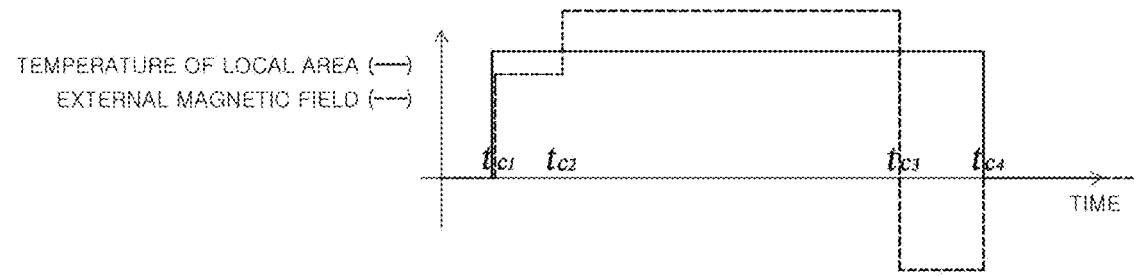
FIG. 7 is an example of a timing diagram showing the temperature of a local area and the intensity of a magnetic field according to an embodiment of the present invention.

FIG. 7 is an example of a timing diagram showing the temperature of a local area and the intensity of a magnetic field according to an embodiment of the present invention. tc1, tc2, tc3, and tc4 of FIG. 7 may correspond respectively to ta1, ta2, ta3, and ta4 of FIG. 5.

FIG. 7 is different only in the intensity of an external upward magnetic field from FIG. 5. That is, the intensity of the magnetic field applied during time from ta1 to ta2 is higher than the intensity of the magnetic field applied during time from ta2 to ta3 in FIG. 5, whereas the intensity of the magnetic field applied during time from tc1 to tc2 is lower than the intensity of the magnetic field applied during time from tc2 to tc3 in FIG. 7.

In FIG. 7, a first area magnetized in the upward direction may appear during the period from tc1 to tc2 or during the period from tc2 to tc3 depending on the intensity of the external magnetic field and heating temperature.

In FIGS. 5 and 7, external magnetic fields having different intensities are applied during the period from ta1 to ta2 (during the period from tc1 to tc2) and during the period from ta2 to ta3 (during the period from tc2 to tc3). However, the present invention is not limited thereto. External magnetic fields having the same intensity may be applied during the period from ta1 to ta2 (during the period from tc1 to tc2) and during the period from ta2 to ta3 (during the period from tc2 to tc3).

FIG. 8 is an example of a timing diagram showing the temperature of a local area and the intensity of a magnetic field according to an embodiment of the present invention. td1, td3, and td4 of FIG. 8 may correspond respectively to tc1, tc3, and tc4 of FIG. 7.

FIG. 8 is different in the intensities of external upward and downward magnetic fields from FIG. 7. That is, a step-shaped upward magnetic field is applied during time from tc1 to tc3 and a downward magnetic field having uniform intensity is applied during time from tc3 to tc4 in FIG. 7, whereas an upward magnetic field applied during time from td1 to td3 gradually increases and then decreases and a downward magnetic field applied during time from td3 to td4 also gradually increases and then decreases in FIG. 8.

That is, the intensity of the magnetic field that is applied in the present invention is not limited to a specific value. As shown in FIG. 8, the magnetic field may be applied in the upward direction until the second area extending in the upward direction is formed, and then the magnetic field may be applied in the downward direction.

FIG. 9 is an example of a timing diagram showing the temperature of a local area and the intensity of a magnetic field according to an embodiment of the present invention. te1, te3, and te4 of FIG. 9 may correspond respectively to td1, td3, and td4 of FIG. 8.

As shown in FIG. 9, the temperature at which the local area is heated may not be uniform. In addition, as shown in FIG. 9, the time at which the local area is heated (t=0) and the time at which the external magnetic field starts to be applied (t=te1) may be different from each other, and the time at which heating of the local area is finished (t=te5) and the time at which application of the external magnetic field is finished (t=te4) may be different from each other.

In the method of forming the doughnut-shaped skyrmion according to the embodiment of the present invention, as described above, the temperature at which the local area is heated, the time at which heating is started, the time at which heating is finished, or the intensity of the external magnetic field is not limited as long as i) the first area magnetized in the opposite direction is formed, ii) the entire area is not magnetized in the opposite direction by the external magnetic field (i.e. the second area must be smaller than the entire area of the vertical magnetic thin film), and iii) the outer radius of the second area that is formed finally is larger than the radius of the third area that is formed therein.

FIGS. 5 to 9 are illustrations of the steps shown in FIGS. 2A to 2D, and the processes shown in FIGS. 2E and 2F may be further performed after the processes shown in FIGS. 5 to 9 are performed.

FIGS. 10A to 10D are views showing the result of forming a doughnut-shaped skyrmion according to an embodiment of the present invention.

A vertical magnetic thin film having the structure shown in FIG. 3 and an initial state in which the vertical magnetic thin film was magnetized in the downward direction was used.

A laser having a wavelength of 660 nm was used in order to heat a local area of the vertical magnetic thin film. The incident power of the laser was 20 mW, and the size of an area on which the laser was condensed was 1 μm or less.

The laser was irradiated for 500 ns in the state in which an external upward magnetic field having a uniform intensity of 10 Oe was ON.

An object lens that was used had a magnifying power of 50 and a numerical aperture (NA) of 0.8.

As shown in FIG. 10A, it can be seen that an upward magnetic domain having a size of 1 μm or less was formed.

Subsequently, the intensity of the external upward magnetic field was increased to 20 Oe in the state in which the upward magnetic domain was formed, and an upward magnetic domain having a size of 20 μm was formed after 10 seconds.

At this time, when the intensity of the external magnetic field is changed to −10 Oe (the direction in which the external magnetic field is applied is changed to the downward direction) and the same laser is irradiated, a primitive doughnut-shaped skyrmion is formed, as shown in FIG. 10B.

Subsequently, when an external magnetic field having an intensity of +20 Oe is applied for 5 seconds, a downward magnetic domain in the center of the upward magnetic domain extends, as shown in FIG. 10C.

Subsequently, when external upward and downward magnetic fields are alternately applied, for example, when an external magnetic field having an intensity of +10 Oe is applied for 1 second, an external magnetic field having an intensity of −10 Oe is applied for 1 second, and an external magnetic field having an intensity of +10 Oe is applied for 1 second, a doughnut-shaped skyrmion, the size of which is small but the shape of which is stable, is formed, as shown in FIG. 10D.

As is apparent from the above description, according to an embodiment of the present invention, it is possible to stably form a doughnut-shaped skyrmion.

Although the present invention has been described in detail based on preferred embodiments, those skilled in the art will appreciate that the present invention is not limited thereto and that various modifications, additions, and substitutions are possible without departing from the scope and spirit of the invention as disclosed in the accompanying claims. Consequently, the true technical protection scope of the present invention should be interpreted by the following claims, and all technical concepts included in a range equivalent thereto should be interpreted as falling within the scope of right of the present invention.

What is claimed is:

1. A method of forming a doughnut-shaped skyrmion, the method comprising:
heating a local area of a vertical magnetic thin film magnetized in a first direction, which is any one of an upward direction and a downward direction;
applying a magnetic field having a second direction, which is opposite the first direction, and having intensity higher than coercive force of the vertical magnetic thin film to the vertical magnetic thin film to form a first area magnetized in the second direction;
applying a magnetic field having the second direction to the vertical magnetic thin film to form a second area, which is an extension of the first area; and
applying a magnetic field having the first direction to the vertical magnetic thin film to form a third area magnetized in the first direction in the second area.

2. The method according to claim 1, wherein, at the step of forming the third area, an outer radius of the second area is reduced.

3. The method according to claim 2, wherein, assuming that the intensity of the magnetic field applied in the first direction and the intensity of the magnetic field applied in the second direction are uniform and identical to each other and that time during which the magnetic field is applied in the first direction and time during which the magnetic field is applied in the second direction are identical to each other, a length (dr1) of a radius of the first area that increases when the first area extends to the second area is greater than a length (dr2) of the outer radius of the second area that decreases.

4. The method according to claim 1, further comprising applying the magnetic field having the first direction to the vertical magnetic thin film having the third area formed therein such that the third area extends within a range within which the second area does not disappear to form a first doughnut shape.

5. The method according to claim 4, further comprising alternately applying the magnetic field having the second direction and the magnetic field having the first direction to the vertical magnetic thin film having the first doughnut shape formed therein to form a second doughnut shape, which is smaller than the first doughnut shape.

6. The method according to claim 5, wherein the intensity of the magnetic field applied at the step of forming the second doughnut shape is lower than the intensity of the magnetic field applied at the step of forming the first doughnut shape.

7. The method according to claim 5, wherein time during which the magnetic field is applied at the step of forming the second doughnut shape is shorter than time during which the magnetic field is applied in the first direction or the second direction at the step of forming the first doughnut shape.

8. The method according to claim 1, wherein the local area is continuously heated while the step of forming the first area, the step of forming the second area, and the step of forming the third area are performed.

9. The method according to claim 8, wherein heating of the local area is finished after application of the magnetic field in the first direction for forming the third area is finished.

10. The method according to claim 8, wherein the local area is heated at uniform temperature.

11. The method according to claim 8, wherein the local area is heated to Curie temperature of the vertical magnetic thin film or higher.

12. The method according to claim 8, wherein time at which the local area is heated and time at which the magnetic field is applied in the second direction are identical to each other.

13. The method according to claim 8, wherein the magnetic field is applied in the second direction after the local area starts to be heated.

14. The method according to claim 1, wherein the intensity of the magnetic field applied at the step of forming the first area is higher than the intensity of the magnetic field applied at the step of forming the second area.

15. The method according to claim 1, wherein the intensity of the magnetic field applied at the step of forming the first area is lower than the intensity of the magnetic field applied at the step of forming the second area.

16. The method according to claim 1, wherein the intensity of the magnetic field applied at the step of forming the first area is identical to the intensity of the magnetic field applied at the step of forming the second area.

17. The method according to claim 1, wherein the vertical magnetic thin film comprises:
- a substrate;
- a first layer formed on the substrate;
- a magnetic layer formed on the first layer;
- a tunnel barrier layer formed on the magnetic layer; and
- a second layer formed on the tunnel barrier layer.

* * * * *